United States Patent [19]

Daniels et al.

[11] 4,048,087

[45] Sept. 13, 1977

[54] CRYSTALLIZING SOLUTION AND METHOD OF PREPARATION THEREOF

[75] Inventors: Roger D. Daniels; John A. Snover, both of Midland, Mich.

[73] Assignee: The Dow Chemical Company, Midland, Mich.

[21] Appl. No.: 770,127

[22] Filed: Oct. 23, 1968

Related U.S. Application Data

[63] Continuation-in-part of Ser. No. 684,099, Nov. 15, 1967, Pat. No. 3,819,335.

[51] Int. Cl.$^2$ .......................... C09K 3/00; C01F 7/00
[52] U.S. Cl. ................................ 252/188; 23/305 A; 423/645
[58] Field of Search .................. 23/204, 305, 305 A; 252/188; 423/645

[56] References Cited

U.S. PATENT DOCUMENTS 3,453,089   7/1969   DelGiudice ............................ 23/305

OTHER PUBLICATIONS

Rice et al., Non-Solvated Aluminum Hydride, Technical Report of O.N.R., Astia AD #106967, Aug. 1, 1956.

*Primary Examiner*—Leland A. Sebastian
*Attorney, Agent, or Firm*—Lloyd S. Jowanovitz

[57] ABSTRACT

The present invention concerns a novel AlH$_3$ crystallizing liquid comprising crystalline aluminum hydride, an aliphatic ether and an inert organic liquid. The invention also concerns a novel process for providing the crystallizing liquid.

13 Claims, No Drawings

CRYSTALLIZING SOLUTION AND METHOD OF PREPARATION THEREOF

BACKGROUND OF THE INVENTION

The invention herein described was made in the course of or under a contract or subcontract thereunder, with the Department of the Air Force. This application is a continuation-in-part of application Ser. No. 684,099, filed Nov. 15, 1967, now U.S. Pat. No. 3,819,335.

Aluminum hydride is suitable for use as a fuel component in solid rocket propellants. However, the aluminum hydride required in solid propellants should consist of relatively large size, i.e., from about 10 to about 50 microns and larger, crystalline aluminum hydride particles (hereinafter sometimes referred to as macrocrystalline particles) which are substantially non ether-solvated. This novel aluminum hydride has been disclosed in a copending application Ser. No. 179,509 of Norman E. Matzek and Donald F. Musinski, filed Mar. 8, 1962, now U.S. Pat. No. 3,819,819, and is identified therein as alpha-aluminum hydride.

A number of methods are known for making various polymorphic crystalline phases of aluminum hydride. In general, these processes, which usually employ an alkyl either as a solvent, have the disadvantage that the $AlH_3$ product is contaminated with impurities and is essentially in a very fine state of subdivision, e.g., submicron in size, which renders the product undesirable for propellant applications. Also, the resulting products are solvated and the solvent member, i.e., ether, is removed with great difficulty. Ordinarily high vacuum techniques are necessary for this separation.

Many of the methods employed in producing crystalline aluminum hydride consist essentially of feeding various types of ether solutions of aluminum hydride into a crystallizing liquid from which crystals of aluminum hydride precipitate under a variety of detailed, carefully controlled conditions. The particular crystalline configuration is somewhat related to the conditions present in the crystallizing liquid during crystallization. However the crystal configuration is even more closely related to the manner of preparing the crystallizing liquid. This is so, because the crystallizing liquid contains, as a rule, small crystals of aluminum hydride which serve as nucleating crystals to induce crystal formation when the ether solution of aluminum hydride is fed into the crystallizing liquid. The nature of the crystals formed depends in large part on the nature of the original nucleating crystals present in the crystallizing liquid which is provided.

The art of preparing crystalline aluminum hydride will be viewed as consisting of two phases. Phase I consists of providing the crucial crystallizing liquid, and Phase II consists of those operations subsequently performed with the so-provided crystallizing liquid, such as contacting the crystallizing liquid with an aluminum hydride feed solution at a predetermined feed rate and temperature. The process of the present invention is directed to providing the initial crystallizing liquid.

It is an object of the present invention to provide a novel crystallizing liquid comprising crystalline aluminum hydride and an aromatic liquid phase.

An advantage of the present invention is that the novel crystallizing liquid can be contacted with an aluminum hydride feed solution on a continuous basis thereby to provide substantially non-ether solvated macrocrystalline aluminum hydride.

Another object of the present invention is to provide a process for preparing a novel crystallizing liquid.

Other objects and advantages of the present invention will become apparent from the following description thereof.

SUMMARY OF THE INVENTION

The present invention comprises providing a nucleating liquid and introducing the nucleating liquid into a bath of heated organic liquid to form the precrystallizing bath. The introduction of the nucleating liquid is continued until crystals of aluminum hydride form in the heated pre-crystallizing bath. Upon crystal formation, the process is complete, i.e., the pre-crystallizing bath is converted into the crystallizing liquid product of the present invention.

In forming the crystallizing bath, the nucleating liquid is introduced into the heated organic liquid at a rate such that the concentration of aluminum hydride in solution in the pre-crystallizing bath does not rise above about 0.005 molar before formation of the first nucleating crystals occur. If concentrations in excess of about 0.005 molar occur, various undesirable, thermally unstable, ether-solvated, or microcrystalline forms of aluminum hydride may be created in the crystallizing liquid.

A further process condition that must be controlled in the preparation of the crystallizing liquid is the amount of alkyl ether present at any one time in the pre-crystallizing bath. Thus ether concentration should not be sufficient to significantly reduce the temperature of the bath, e.g., lower its temperature more than about 0.75 to 1° C.

The ether concentration is directly related to the temperature of the pre-crystallizing bath because in vaporizing, the ether removes heat from the bath, thereby lowering the bath temperature and thus its capacity to volatilize the ether. Therefore the ether concentration in the bath can be maintained at acceptable minimum levels by heating the organic liquid at a volatilizing temperature for the ether before and during introduction of the nucleating liquid. If the bath temperature falls below the volatilizing temperature, the presence of excessive amounts of ether is indicated.

A suitable volatilizing temperature for the organic liquids to be described hereinafter is a temperature within the range of about 80° C. to about 140° C., and preferably from about 80° C. to about 110° C. The lower limit for volatilizing temperatures could extend even below about 80° C. but in such event the formation of the crystallizing liquid requires more time, as the nucleating liquid must be added at a slower rate because the ether does not volatilize as readily.

In the above described process, the temperature of the pre-crystallizing bath may be maintained within the prescribed limits by increasing or decreasing the rate of heating or by other means known to those skilled in the art. However, if the rate of heating is to remain relatively constant, the temperature of the pre-crystallizing bath can still be controlled by introducing the nucleating liquid at a rate sufficiently slow so that the temperature of the pre-crystallizing bath is maintained within the prescribed range, i.e., at or above the volatilizing temperature.

Preferably during introduction of the nucleating liquid, the temperature of the pre-crystallizing bath is maintained at the reflux temperature thereof by heating.

The reflux temperature is substantially equal to the reflux temperature of the organic liquid component. The requisite minimal concentrations of ether are maintained by controlling the rate of introduction of nucleating liquid so that the reflux temperature of the pre-crystallizing bath remains substantially equal to the reflux temperature of the organic liquid.

When the organic liquid is benzene, and the nucleating liquid comprises $AlH_3$, benzene and diethyl ether, a suitable rate of introduction of the nucleating liquid into the organic liquid is about 0.2 to about 10 millimoles per minute of $AlH_3$ (dissolved in the nucleating liquid) per liter of the pre-crystallizing bath. This rate presupposes that the temperature of the pre-crystallizing liquid is to be maintained at about the reflux temperature of the organic liquid, i.e., at substantially 80° C. If the reflux temperature falls below about 79.5° C., there is a reduced chance of obtaining a crystallizing liquid capable of producing uncontaminated, non ether-solvated macrocrystalline $AlH_3$.

The nucleating liquid comprises aluminum hydride and lithium aluminum hydride carried in a mixture of an inert organic liquid and an aliphatic ether. The inert organic liquid is of the same type as the organic liquid into which the nucleating liquid is introduced. The nucleating liquid generally comprises sufficient quantities of aluminum hydride and lithium aluminum hydride so that the concentration of aluminum hydride ranges from about 0.05 to about 1.0 molar, and the aluminum hydride/lithium hydride mole ratio ranges from about 2 to about 10.

The amount of ether in the nucleating liquid must be sufficient to maintain the aluminum hydride in solution. Preferably the amount of ether employed in the nucleating liquid will be kept at a minimum, consequently the nucleating liquid is preferably substantially saturated with respect to the aluminum hydride solute. When the inert organic liquid is benzene, the nucleating liquid will comprise from about 5 to about 99.5 weight percent ether and preferably from about 10 to about 35 percent ether with the balance being benzene.

The nucleating liquid can be prepared by commonly employed means such as reacting lithium aluminum hydride with aluminum chloride, employing ether and the inert organic liquid as the reaction medium, Preferably an excess of the reactants (in relation to the solubility capacity of the reaction medium) will be employed so that some of the aluminum hydride reaction product precipitates in the reaction medium, thereby indicating that the so-produced nucleating liquid is substantially saturated with respect to the aluminum hydride solute. When precipitated aluminum hydride is present, the liquid is filtered, or otherwise subjected to a solids-liquid separation to remove the hydride prior to use of the liquid. Solids thus recovered can be subsequently used in the aluminum hydride feed mixture of Phase II.

Optionally, lithium borohydride or other similar crystal promoting metallic hydrides can be incorporated into the nucleating liquid. These reagents serve to promote crystallization of thermally stable, macrocrystalline, non ether-solvated aluminum hydride from the crystallizing liquid. If the solubilizing agent is lithium borohydride, sufficient amounts thereof should be present in the nucleating liquid so that the aluminum hydride/lithium borohydride molar ratio is in the range from about 1 to about 10.

The volume of the bath of inert organic liquid into which the nucleating liquid is to be introduced is an important variable. If the amount of the inert organic liquid is sufficiently large the temperature of the resulting pre-crystallizing bath, upon introduction therein of the nucleating liquid, will not differ greatly from that of the inert organic liquid. Thus, the larger the volume of inert organic liquid, the faster the rate at which the nucleating liquid can be introduced. However, a point is reached where the convenience of higher feed rates is offset by the poorer economy of operation resulting from the greater bulk of the pre-crystallizing liquid which necessitates more complex and costly equipment.

Inert organic liquids which can be employed have a boiling temperature of greater than about 60° C. and are miscible with the aliphatic ether. Specific examples of inert organic liquids are benzene, toluene, biphenyl, xylene, biphenyl benzene, decane, an azeotrope of 1 part by volume benzene to 1.15 parts of volume cyclohexane, an azeotrope of 1 part by volume benzene to 1.35 parts by volume 2,4-dimethylpentane, a 1:1 volume mixture of benzene:n-hexane, a 1:1.5 volume mixture of benzene:2,3-dimethylbutane, 2,3-dimethylbutane, 2,2-dimethylbutane. Preferably the inert organic liquid is benzene.

Aliphatic ethers which can be employed in the present invention preferably have from 4 to 10 carbon atoms. The ether must also be lower boiling than the inert organic liquid component of the crystallizing liquid, e.g., if benzene is the inert organic liquid, the ether must have a boiling point of less than 80° C. Examples of aliphatic ethers which can be employed are diethyl ether, di-n-propyl ether, di-isopropyl ether, and di-sec.-butyl ether. Preferably the ether will be diethyl ether. Preferably the nucleating liquid, pre-crystallizing liquid, and crystallizing liquid should be maintained substantially free of impurities. For the optimum in product yield and purity, all reagents employed are substantially anhydrous, an all processing and material handling is carried out in a substantially anhydrous inert atmosphere.

The crystallizing liquid produced by the process of the present invention can be employed as a reducing medium in the reduction of aldehydes and ketones. Additionally, the crystallizing liquid can be employed as a coating bath in processes whereby various fabrics and polymeric materials are coated with aluminum.

The crystallizing liquid can also be employed in Phase II processes by contacting it substantially immediately upon formation while the liquid is substantially at the volatilizing temperature with a wide variety of aluminum hydride feed mixtures to produce the thermally stable, substantially non ether-solvated, macrocrystalline aluminum hydride on a continuous basis. As the introduction of the feed mixture progresses, the temperature of the resulting reaction mixture drops to its reflux temperature, or other suitable temperature. Where the organic liquid is benzene, and the ether is diethyl ether, the original introduction of the feed mixture takes place at about 80° C., and as introduction proceeds, the temperature of the resulting reaction mixture drops to from about 76° C. to about 76.5° C.

Usually, the aluminum hydride feed material of Phase II is prepared by reacting lithium aluminum hydride and aluminum chloride in an ether-inert organic liquid solvent mixture. Alternatively, aluminum hydride prepared by other processes or a solid ether solvated aluminum hydride can be dissolved and/or slurried in a mixture of ether and inert organic liquid and employed as the aluminum hydride feed material.

The following examples are set forth to illustrate the present invention but are not to be construed as a limitation thereof.

EXAMPLE 1

(Preparation)

Aluminum hydride nucleating liquid was prepared by reacting about 25 millimoles of aluminum chloride with about 77.5 millimoles of lithium aluminum hydride ($LiAlH_4/AlH_3$ mole ratio $\simeq \frac{1}{3}$) in the presence of about 250 millimeters of diethyl ether and about 250 milliliters of benzene. The aluminum hydride concentration in the nucleating liquid thus prepared was about 0.2 molar. About 1.0 liter of benzene was heated to about 80° C. (the volatilization temperature) and the nucleating liquid was introduced at a rate of about 0.2 millimoles of $AlH_3$/minute per liter of benzene. At no time did the boiling point of the pre-crystallizing bath fall below about 79.5° C. After about 10–15 minutes, crystals of aluminum hydride from about 10 to about 50 microns in size formed in the heated pre-crystallizing liquid.

EXAMPLE 2

(Utility)

Commencing Phase II, so-produced crystallizing liquid was contacted with aluminum hydride feed mixture comprising a slurry of aluminum hydride in ether and benzene as carrier liquids. The slurry comprised about 5 weight percent solids with the carrier liquid being saturated with respect to the aluminum hydride solute and comprising from about 10 to about 35 weight percent ether with the balance being benzene. The rate of introduction of the feed mixture into the crystallizing liquid was about 8 millimoles/minute per liter of crystallizing liquid. The refluxing temperature of the reaction mixture gradually declined from about 80° C. to about 76.5° C.

The aluminum hydride crystals produced were non ether-solvated and ranged in size from about 10 to about 150 microns in size when measured along the longest crystalline surface.

All reagents employed were substantially anhydrous, and all processing and material handling was carried out in a substantially anhydrous nitrogen atmosphere. The nucleating liquid, and the crystallizing liquid produced were substantially free of lithium chloride, water and hydrolysis products thereof.

Various modifications may be made in the present invention without departing from the spirit or scope thereof, and it is understood that we limit ourselves only as defined in the appended claims.

What is claimed is:

1. A process for preparing an aluminum hydride crystallizing liquid comprising:
    a. providing a nucleating liquid comprising aluminum hydride and lithium aluminum hydride carried in a mixture of an inert organic liquid with a boiling point greater than about 60° C. and an aliphatic ether having a lower boiling point than the inert organic liquid, said aluminum hydride and lithium aluminum hydride being present in sufficient quantities so that the concentration of aluminum hydride in the nucleating liquid is within the range of about 0.05 to about 1 molar, and the aluminum hydride/lithium aluminum hydride mole ratio is within the range from about 2 to about 10, said ether being present in a sufficient amount to maintain the aluminum hydride in solution,
    b. providing a bath or organic liquid heated to a volatilization temperature,
    c. introducing said nucleating liquid into said heated organic liquid thereby to form a pre-crystallizing bath while maintaining the temperature of the pre-crystallizing bath at or above said volatilizing temperature, and
    d. continuing to introduce said nucleating liquid into the pre-crystallizing bath and maintaining the temperature of the bath at or above the volatilization temperature until crystals of aluminum hydride form in the pre-crystallizing bath.

2. A process as in claim 1 wherein the rate of introduction of nucleating liquid into the precrystallizing bath is sufficiently slow so that the temperature of said bath remains at or above the volatilization temperature.

3. A process as in claim 1 wherein the volatilizing temperature is substantially equal to the reflux temperature of the organic liquid.

4. A process as in claim 1 wherein the volatilizing temperature is within the range of about 80° C. to about 140° C.

5. A process as in claim 1 wherein the volatilizing temperature is within the range of about 80° C. to about 110° C.

6. The process as defined in claim 1 wherein the mixture of aliphatic ether and organic liquid in the nucleating liquid comprises from about 5 to about 99.5 weight percent ether with the balance being benzene.

7. The process as defined in claim 1 wherein the nucleating liquid is substantially saturated with respect to the aluminum hydride component thereof.

8. The process as defined in claim 1 wherein the nucleating liquid comprises sufficient lithium borohydride so that the aluminum hydride/lithium borohydride molar ratio is from about 1 to about 10.

9. The process defined in claim 1 wherein the inert organic liquid is a member selected from the group consisting of benzene, toluene, biphenyl, xylene, biphenyl benzene, decane, an azeotrope of 1 part by volume benzene to 1.15 parts by volume cyclohexane, an azeotrope of 1 part by volume benzene to 1.35 parts by volume 2,4-dimethylpentane, a 1:1 volume mixture of benzene:n-hexane, a 1:1.5 volume mixture of benzene:3-methyl pentane, and a 1:1.5 volume mixture of benzene: 2,3-dimethylbutane, 2,3-dimethylbutane, 2,2-dimethylbutane.

10. The process as defined in claim 1 including continuously contacting the freshly-prepared heated crystallizing liquid with an aluminum hydride feed material.

11. An aluminum hydride crystallizing liquid prepared by the process defined in claim 1.

12. The process defined in claim 1 wherein the aliphatic ether comprises from 4 to 10 carbon atoms.

13. The process defined in claim 1 wherein the aliphatic ether is diethyl ether, and the inert organic liquid is benzene.

* * * * *